(12) United States Patent
Ujihara et al.

(10) Patent No.: US 11,935,936 B2
(45) Date of Patent: Mar. 19, 2024

(54) ALUMINUM ALLOY FILM, METHOD OF PRODUCING THE SAME, AND THIN FILM TRANSISTOR

(71) Applicant: ULVAC, INC., Chigasaki (JP)

(72) Inventors: Yuusuke Ujihara, Chigasaki (JP); Motoshi Kobayashi, Chigasaki (JP); Yasuhiko Akamatsu, Chigasaki (JP); Tomohiro Nagata, Chigasaki (JP); Ryouta Nakamura, Chigasaki (JP); Junichi Nitta, Chigasaki (JP); Yasuo Nakadai, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 681 days.

(21) Appl. No.: 17/055,852

(22) PCT Filed: Mar. 28, 2019

(86) PCT No.: PCT/JP2019/013570
§ 371 (c)(1),
(2) Date: Nov. 16, 2020

(87) PCT Pub. No.: WO2020/003667
PCT Pub. Date: Jan. 2, 2020

(65) Prior Publication Data
US 2021/0226028 A1  Jul. 22, 2021

(30) Foreign Application Priority Data
Jun. 28, 2018 (JP) .................................. 2018-123157

(51) Int. Cl.
*H01L 29/49* (2006.01)
*C22C 21/00* (2006.01)
(Continued)

(52) U.S. Cl.
CPC .............. *H01L 29/49* (2013.01); *C22C 21/00* (2013.01); *C22F 1/04* (2013.01); *C23C 14/14* (2013.01); *H01L 21/285* (2013.01); *C23C 14/34* (2013.01)

(58) Field of Classification Search
CPC ... H01L 29/49; H01L 21/285; H01L 29/7869; H01L 21/28; H01L 23/53219;
(Continued)

(56) References Cited

U.S. PATENT DOCUMENTS

RE45,481 E * 4/2015 Ishigami ................. C23C 14/14
  438/584
9,803,283 B1 * 10/2017 Martin .................... C23C 18/30
(Continued)

FOREIGN PATENT DOCUMENTS

CN         1432070 A    7/2003
CN       101918888 A   12/2010
(Continued)

OTHER PUBLICATIONS

Office Action dated Apr. 30, 2022 in Korean Application No. 10-2020-7037510.
(Continued)

*Primary Examiner* — Karen Kusumakar
*Assistant Examiner* — Adam S Bowen
(74) *Attorney, Agent, or Firm* — Saliwanchik, Lloyd & Eisenschenk

(57) ABSTRACT

[Object] It is an object of the present invention to provide an aluminum alloy film having excellent bending resistance and heat resistance, and a thin film transistor including the aluminum alloy film.
[Solving Means] In order to achieve the above-mentioned object, an aluminum alloy film according to an embodiment of the present invention includes: an Al pure metal that
(Continued)

includes at least one type of a first additive element selected from the group consisting of Zr, Sc, Mo, Y, Nb, and Ti. A content of the first additive element is 0.01 atomic % or more and 1.0 atomic % or less. Such an aluminum alloy film has excellent bending resistance and excellent heat resistance. Further, also etching can be performed on the aluminum alloy film.

7 Claims, 4 Drawing Sheets

(51) Int. Cl.
  *C22F 1/04* (2006.01)
  *C23C 14/14* (2006.01)
  *H01L 21/285* (2006.01)
  *C23C 14/34* (2006.01)

(58) Field of Classification Search
  CPC ........... H01L 29/4908; H01L 21/28088; H01L 21/2855; H01L 29/42384; H01L 29/4966; H01L 29/786; C22C 21/00; C22F 1/04; C22F 1/00; C23C 14/14; C23C 14/34; C23C 14/3414; C23C 26/00
  See application file for complete search history.

(56) References Cited

U.S. PATENT DOCUMENTS

| | | |
|---|---|---|
| 2001/0047838 A1 | 12/2001 | Segal et al. |
| 2002/0174916 A1 | 11/2002 | Segal et al. |
| 2002/0174917 A1 | 11/2002 | Segal et al. |
| 2003/0047812 A1 | 3/2003 | Hagihara et al. |
| 2004/0126608 A1 | 7/2004 | Gotoh et al. |
| 2005/0118811 A1 | 6/2005 | Murata |
| 2011/0008640 A1 | 1/2011 | Goto et al. |
| 2012/0301732 A1 | 11/2012 | Okuno et al. |
| 2014/0086791 A1 | 3/2014 | Okuno et al. |
| 2015/0171016 A1 | 6/2015 | Okuno et al. |

FOREIGN PATENT DOCUMENTS

| | | |
|---|---|---|
| CN | 103534789 A | 1/2014 |
| EP | 1 553 205 A1 | 7/2005 |
| JP | 2003-73810 A | 3/2003 |
| JP | 2004-204284 A | 7/2004 |
| JP | 2004-214606 A | 7/2004 |
| JP | 2005-171378 A | 6/2005 |
| JP | 2011-190531 A | 9/2011 |
| JP | 2012-180540 A | 9/2012 |
| JP | 2015-156482 A | 8/2015 |
| WO | WO-2009/123217 A1 | 10/2009 |

OTHER PUBLICATIONS

Office Action dated Dec. 26, 2022 in Korean Application No. 10-2020-7037510.
Office Action dated Jun. 17, 2021 in Chinese Application No. 201980039161.2, along with its English translation.
International Search Report in International Application No. PCT/JP2019/013570, filed Mar. 28, 2019.
Notice of Reasons for Refusal dated Oct. 12, 2020 in Japanese Application No. 2019-547523, along with its machine translation.
Office Action dated Mar. 29, 2022 in Chinese Application No. 201980039161.2.

* cited by examiner

ALUMINUM ALLOY FILM, METHOD OF PRODUCING THE SAME, AND THIN FILM TRANSISTOR

CROSS-REFERENCE TO RELATED APPLICATIONS

This application is the U.S. national stage application of International Patent Application No. PCT/JP2019/013570, filed Mar. 28, 2019, which claims the benefit under 35 U.S.C. § 119 of Japanese Application No. 2018-123157, filed Jun. 28, 2018, the disclosures of each of which are incorporated herein by reference in their entirety.

TECHNICAL FIELD

The present invention relates to an aluminum alloy film, a method of producing the same, and a thin film transistor including the aluminum alloy film.

BACKGROUND ART

In thin film transistors (TFT) such as a liquid crystal display device and an organic EL display device, for example, an Al wiring is used as a low resistance wiring material in some cases.

However, among the wirings, a gate electrode is generally formed in the middle of the production step, and thus, the gate electrode is subjected to a thermal history due to annealing processing after the gate electrode is formed. For this reason, a refractory metal (e.g., Mo) that can withstand the thermal history is often used as the material of the gate electrode (see, for example, Patent Literature 1).

CITATION LIST

Patent Literature

Patent Literature 1: Japanese Patent Application Laid-open No. 2015-156482

DISCLOSURE OF INVENTION

Technical Problem

However, in the case where a refractory metal such as Mo is applied to an electrode of a curved surface portion of a display including a screen having a curved surface shape or a foldable display that is bendable, since the refractory metal does not have sufficient bending resistance, there is a possibility that the electrode is broken by bending.

Further, in the case of employing an electrode material having excellent flexibility instead of the refractory metal, the electrode needs to have sufficient resistance against a thermal history.

In view of the circumstances as described above, it is an object of the present invention to provide an aluminum alloy film having excellent bending resistance and heat resistance, and a thin film transistor including the aluminum alloy film.

Solution to Problem

In order to achieve the above-mentioned object, an aluminum alloy film according to an embodiment of the present invention includes: an Al pure metal that includes at least one type of a first additive element selected from the group consisting of Zr, Sc, Mo, Y, Nb, and Ti.

A content of the first additive element is 0.01 atomic % or more and 1.0 atomic % or less.

Such an aluminum alloy film has excellent bending resistance and excellent heat resistance. Further, also etching can be performed on the aluminum alloy film.

The aluminum alloy film may further include at least one type of a second additive element selected from the group consisting of Mn, Si, Cu, Ge, Mg, Ag, and Ni, in which a content of the second additive element is 0.2 atomic % or more and 3.0 atomic % or less.

Such an aluminum alloy film has excellent bending resistance and also excellent heat resistance. Further, also etching can be performed on the aluminum alloy film.

In order to achieve the above-mentioned object, an aluminum alloy film according to an embodiment of the present invention includes: an Al pure metal that includes at least one type of a second additive element selected from the group consisting of Mn, Si, Cu, Ge, Mg, Ag, and Ni.

A content of the second additive element is 0.2 atomic % or more and 3.0 atomic % or less.

Such an aluminum alloy film has excellent bending resistance and excellent heat resistance. Further, also etching can be performed on the aluminum alloy film.

In the aluminum alloy film may further include: at least one type of a third additive element selected from the group consisting of Ce, Nd, La, and Gd, in which a content of the third additive element may be 0.1 atomic % or more and 1.0 atomic % or less.

Such an aluminum alloy film has excellent bending resistance, and has excellent heat resistance due to precipitation of the third additive element at the grain boundary. Further, also etching can be performed on the aluminum alloy film.

In the aluminum alloy film, the aluminum alloy film may have bending resistance that can withstand bending in a case of being bent to a bending radius of 1 mm.

In the aluminum alloy film, dry etching and wet etching may be possible.

In the aluminum alloy film, a surface roughness P–V value may be 50 nm or less.

In the aluminum alloy film, specific resistance may be 10 μΩ·cm or less.

In order to achieve the above-mentioned object, a thin film transistor according to an embodiment of the present invention includes a gate electrode including the above-mentioned aluminum alloy film.

Further, in order to achieve the above-mentioned object, according to an embodiment of the present invention, a method of producing the aluminum alloy film is provided.

Advantageous Effects of Invention

As described above, according to the present invention, it is possible to provide an aluminum alloy film having excellent bending resistance and heat resistance, a method of producing the same, and a thin film transistor including the aluminum alloy film.

MODE(S) FOR CARRYING OUT THE INVENTION

Hereinafter, an embodiment of the present invention will be described with reference to the drawings. In each drawing, XYZ axis coordinates are introduced in some cases. Further, the same members or members having the same function are denoted by the same reference symbols, and after the member is described, description of thereof is omitted as appropriate in some cases.

(Thin Film Transistor)

Figure 1A:
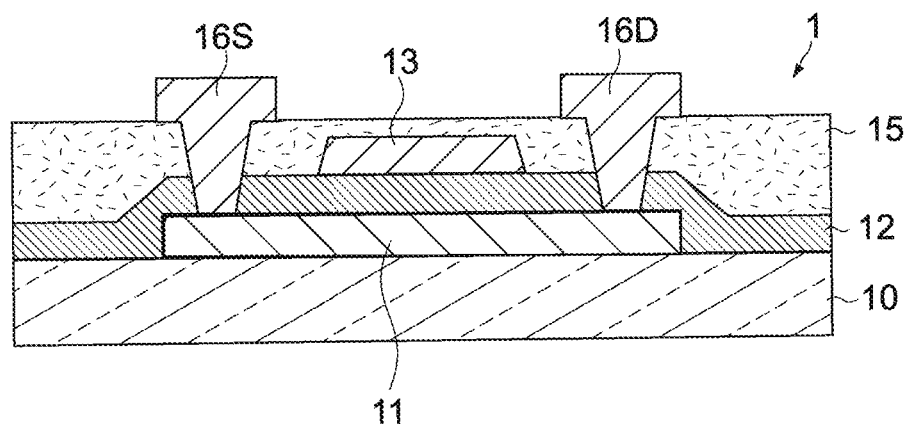
FIGS. 1A and 1B are schematic cross-sectional views of a thin film transistor including an Al alloy film according to this embodiment.
Figure 1B:
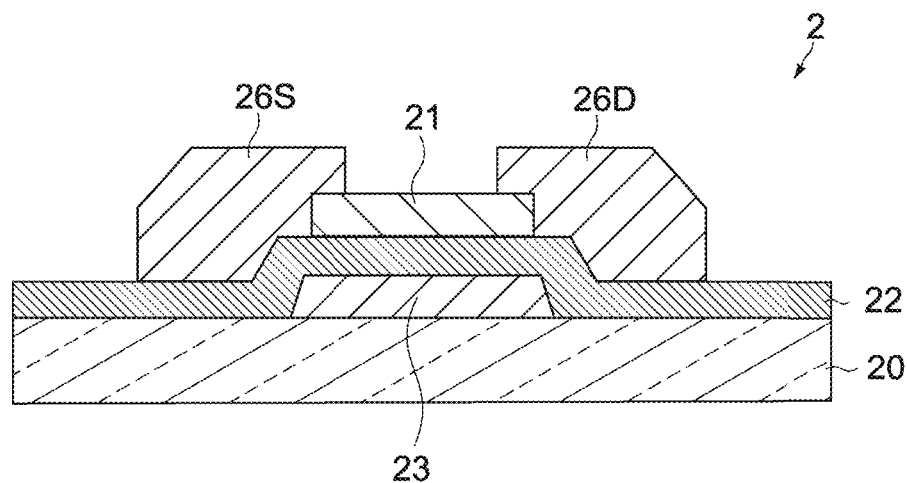

FIG. 1A and FIG. 1B are each a schematic cross-sectional view of a thin film transistor including an Al alloy film according to this embodiment.

A thin film transistor 1 shown in FIG. 1A is a top-gate thin film transistor. In the thin film transistor 1, an active layer (semiconductor layer) 11, a gate insulation film 12, a gate electrode 13, and a protective layer 15 are stacked on a glass substrate 10. The active layer 11 is formed of, for example, LTPS (low temperature poly-silicon). The active layer 11 is electrically connected to a source electrode 16S and a drain electrode 16D.

A thin film transistor 2 shown in FIG. 1B is a bottom-gate thin film transistor. In the thin film transistor 2, a gate electrode 23, a gate insulation film 22, an active layer 21, a source electrode 26S, and a source electrode 26D are stacked on a glass substrate 20. The active layer 21 is formed of, for example, an IGZO (In—Ga—Zn—O)-based oxide semiconductor material. The active layer 21 is electrically connected the source electrode 26S and the drain electrode 26D.

The thickness of each of the gate electrodes 13 and 23 is not particularly limited, but is, for example, 100 nm or more and 600 nm or less, favorably 200 nm or more and 400 nm or less. In the case of the thickness of less than 100 nm, it is difficult to reduce the resistance of each of the gate electrodes 13 and 23. In the case of the thickness exceeding 600 nm, the bending resistance of the thin film transistor 2 tends to decrease. Each of the gate electrodes 13 and 23 is formed of the Al alloy film according to this embodiment. The specific resistance of each of the gate electrodes 13 and 23 (Al alloy film) is set to, for example, 15 $\mu\Omega\cdot cm$ or less, favorably 10 $\mu\Omega\cdot cm$ or less.

Each of the gate electrodes 13 and 23 is formed by depositing a solid Al alloy film by a sputtering method and then patterning it into a predetermined shape. As the sputtering method, for example, a DC sputtering method, a pulse DC sputtering method, an RF sputtering method, or the like is applied. Any of wet etching or dry etching is applied to patterning of the solid Al alloy film. The deposition and patterning of each of the gate electrodes 13 and 23 is generally performed in the middle of the process of producing the thin film transistors 1 and 2, respectively.

For example, in the process of producing each of the thin film transistors 1 and 2, heat treatment (annealing) is performed as necessary. For example, in order to activate the active layer 11, heat treatment at 550° C. or higher and 650° C. or less is performed for 30 seconds or longer and 30 minutes or shorter in some cases. Further, in the gate insulation film 22, heat treatment at 350° C. or more and 450° C. or less is performed for 30 minutes or more and 180 minutes or less in some cases in order to repairing insulation.

Therefore, there is also a method of selecting method of selecting, as the material of each of the gate electrodes 13 and 23, a refractory metal (e.g., Mo) that can withstand such a thermal history.

However, in recent years, the thin film transistors 1 and 2 are applied to not only a flat type display device but also a curved type display device including a curved periphery portion, a bendable type display device bent in an arc shape, a foldable type display device that can be folded 180 degrees, or the like.

If a gate electrode that includes a refractory metal (e.g., Mo) as a base material is applied to a curved surface portion of such a display device, since the refractory metal does not have sufficient bending resistance, there is a possibility that a part of the gate electrode is cracked and broken. In particular, since the gate electrode is not simply a wiring for flowing a current and has a role of forming a channel in the opposing semiconductor layer, in the case where the gate electrode is applied to a curved surface portion of a display device, it is favorable that the gate electrode is not cracked or broken and has excellent bending resistance.

In order to cope with this, there is a method of applying an Al pure metal having excellent flexibility to the material of the gate electrode. However, in the case of forming the gate electrode of an Al pure metal, the crystal grain size of Al increases due to the history of heat treatment, a stress (compressive stress, tensile stress) occurs in the gate electrode, and hillocks are generated on the surface of the electrode in some cases.

If such hillocks are peeled off from the gate electrode, there is a possibility that the gate electrode has high resistance or the gate electrode is disconnected. Further, in the case where another film is formed on the hillocks, there is a possibility that this film has high resistance or disconnected due to the shape of the underlying hillocks.

Further, since any of wet etching and dry etching is applied to the patterning of each of the gate electrodes 13 and 23, the gate electrodes 13 and 23 are required to be processed without any residue by wet etching and dry etching.

As described above, the electrode material forming the gate electrodes 13 and 23 is required not only to form the gate electrodes 13 and 23 having low resistance but also to have bending resistance that can withstand bending even in the case of being bent to a bending radius of 1 mm, to have excellent heat resistance that inhibits hillocks from being generated, and to be etched without any residue.

(Al Alloy Film)

In this embodiment, in order to cope with the above-mentioned problem, as the material of the gate electrodes 13 and 23, the Al alloy film described below is applied.

The Al alloy film according to this embodiment includes an Al pure metal as a base material, and the Al pure metal includes at least one type of a first additive element selected from the group consisting of Zr, Sc, Mo, Y, Nb, and Ti. Here, in the Al alloy film, the content of the first additive element is adjusted to, for example, 0.01 atomic % or more and 1.0 atomic % or less, favorably 0.1 atomic % or more and 0.5 atomic % or less.

Such an Al alloy film has excellent bending resistance and exhibits the effect achieved by adding the first additive element.

For example, as the effect achieved by adding the first additive element, fine intermetallic compounds (average particle size 1 μm or less) formed of Al and the first additive element are dispersedly formed in the Al alloy even in the case where heat treatment is performed on the Al alloy film.

As a result, for example, the Orowan stress due to the intermetallic compound acts as a barrier for dislocation line movement in the Al alloy, plastic deformation of the Al alloy film is suppressed even in the case where heat treatment is performed on the Al alloy film. As a result, hillocks are hardly generated in the Al alloy film, and an Al alloy film having high heat resistance is formed.

In particular, if hillocks are generated in the gate electrode 13 or 23 during production of a display device, there is a possibility that an electrical failure occurs in the gate electrode 13 or 23 or another wiring film. In this embodiment, it is possible to apply the above-mentioned Al alloy film to the gate electrodes 13 and 23 to provide a highly reliable display device.

Here, if the content of the first additive element is less than 0.01 atomic %, the concentration of the intermetallic compound in the Al alloy film is low and hillocks are likely to be generated in the Al alloy film in the case where heat treatment is performed on the Al alloy film. That is, the heat resistance of the Al alloy film is reduced, which is not favorable. Meanwhile, if the content of the first additive element is more than 1.0 atomic %, the heat resistance is maintained, but the bending resistance of the Al alloy film deteriorates and the specific resistance of the Al alloy film increases, which is not favorable.

Further, any of wet etching and dry etching can be performed on the Al alloy film including the first additive element at the above-mentioned concentration.

Further, in the Al alloy film, the Al pure metal may include, instead of the first additive element, at least one type of a second additive element selected from the group consisting of Mn, Si, Cu, Ge, Mg, Ag, and Ni. In this case, in the Al alloy film, the content of the second additive element is adjusted to, for example, 0.2 atomic % or more and 3.0 atomic % or less, favorably 0.5 atomic % or more and 1.5 atomic % or less.

Such an Al alloy film has excellent bending resistance and exhibits an effect achieved by adding the second additive element.

For example, as the effect achieved by adding the second additive element, the second additive element is well dissolved in Al and plastic deformation of the Al alloy film is suppressed even in the case where heat treatment is performed on the Al alloy film. Further, Al and the second additive element form an intermetallic compound in the Al alloy film in some cases. As a result, hillocks are hardly generated in the Al alloy film, and thus, an Al alloy film having high heat resistance is formed.

Here, if the content of the second additive element is less than 0.2 atomic %, the concentration of the second additive element (solid solution strengthening element) in the Al alloy film is low and hillocks are likely to be generated in the Al alloy film in the case where heat treatment is performed on the Al alloy film. That is, the heat resistance of the Al alloy film is reduced, which is not favorable. Meanwhile, if the content of the second additive element is more than 3.0 atomic %, the heat resistance is maintained, but the bending resistance of the Al alloy film deteriorates and the specific resistance of the Al alloy film increases, which is not favorable.

Further, any of wet etching and dry etching can be performed on the Al alloy film including the second additive element at the above-mentioned concentration.

Further, in the Al alloy film, the first additive element and the second additive element may be added to the Al pure metal.

For example, the Al alloy film may be a film in which the Al pure metal includes at least one type of the first additive element selected from the group consisting of Zr, Sc, Mo, Y, Nb, and Ti, and at least one type of the second additive element selected from the group consisting of Mn, Si, Cu, Ge, Mg, Ag, and Ni. In this case, in the Al alloy film, the content of the first additive element is adjusted to, for example, 0.01 atomic % or more and 1.0 atomic % or less, favorably 0.1 atomic % or more and 0.5 atomic % or less, and the content of the second additive element is adjusted to, for example, 0.2 atomic % or more and 3.0 atomic % or less, favorably 0.5 atomic % or more and 1.5 atomic % or less.

Such an Al alloy film has excellent bending resistance, and synergistically exhibits the effect achieved by adding the first additive element and the effect achieved by adding the second additive element.

For example, in the Al alloy film before heat treatment, intermetallic compounds are not sufficiently dispersedly formed in some cases. Even in such a case, since the Al alloy film already includes the second additive element (solid solution strengthening element), the Al alloy film is already in the state where hillocks are hardly formed. Meanwhile, once heat treatment is performed on the Al alloy film and intermetallic compounds are dispersedly formed in the Al alloy film, movement of dislocation lines is suppressed by intermetallic compounds formed of Al and the first additive element even in the case where a stress occurs in the Al alloy film due to the aggregates of Al and the second additive element. For this reason, hillocks are hardly generated in the Al alloy.

Further, the Al alloy film may be a film in which the Al pure metal includes at least one type of the first additive element selected from the group consisting of Zr, Sc, Mo, Y, Nb, and Ti, and at least one type of a third additive element selected from the group consisting of Ce, Nd, La, and Gd. In this case, in the Al alloy film, the content of the first additive element is adjusted to, for example, 0.01 atomic % or more and 1.0 atomic % or less, favorably 0.1 atomic % or more and 0.5 atomic % or less, and the content of the third additive element is adjusted to, for example, 0.1 atomic % or more and 1.0 atomic % or less, favorably 0.2 atomic % or more and 0.7 atomic % or less.

Such an Al alloy film has excellent bending resistance and synergistically exhibits the effect achieved by adding the first additive element and the effect achieved by adding the third additive element.

For example, by adding the third additive element to the Al alloy including the first additive element, the function of the first additive element is further promoted. For example, in the case where the third additive element is added to the Al alloy, intermetallic compounds formed of Al and the first additive element are more uniformly dispersed in the Al alloy.

Further, the third additive element has a property of precipitating toward the grain boundary when heat treatment is performed thereon. As a result, in the Al alloy film, the grain boundary becomes a barrier, and the phenomenon adjacent microcrystals are connected and the crystal becomes coarse is suppressed. As a result, a stress hardly occurs in the Al alloy film, and the heat resistance of the Al alloy film is further improved.

Here, if the content of the third additive element is less than 0.1 atomic %, the heat resistance of the Al alloy film is reduced, which is not favorable. Meanwhile, if the content of the third additive element is more than 1.0 atomic %, a residue is easily generated in the case where wet etching or dry etching is performed on the Al alloy film, which is not favorable.

Further, the Al alloy film may be a film in which the Al pure metal includes at least one type of the second additive element selected from the group consisting of Mn, Si, Cu, Ge, Mg, Ag, and Ni, and at least one of the third additive element selected from the group consisting of Ce, Nd, La, and Gd. In this case, in the Al alloy film, the content of the second additive element is adjusted to, for example, 0.2 atomic % or more and 3.0 atomic % or less, favorably 0.5 atomic % or more and 1.5 atomic % or less, and the content of the third additive element is adjusted to, for example, 0.1 atomic % or more and 1.0 atomic % or less, favorably 0.2 atomic % or more and 0.7 atomic % or less.

Such an Al alloy film has excellent bending resistance, and synergistically exhibits the effect achieved by adding the second additive element and the effect of achieved by adding the third additive element.

For example, by adding the third additive element to the Al alloy including the second additive element, the function of the second additive element is further promoted. For example, by adding the third additive element to the Al alloy, the second additive element is more uniformly dispersed in the Al alloy. Further, due to the property that the third additive element moves toward the grain boundary by heat treatment, the phenomenon that adjacent fine particles are connected and the fine particles become coarse is suppressed in the Al alloy film. As a result, a stress hardly occurs in the Al alloy film, and the heat resistance of the Al alloy film is further improved.

Further, the Al alloy film may be a film in which the Al pure metal includes at least one type of the first additive element selected from the group consisting of Zr, Sc, Mo, Y, Nb, and Ti, at least one type of the second additive element selected from the group consisting of Mn, Si, Cu, Ge, Mg, Ag, and N, and at least one type of the third additive element selected from the group consisting of Ce, Nd, La, and Gd. In this case, in the Al alloy film, the content of the first additive element is adjusted to, for example, 0.01 atomic % or more and 1.0 atomic % or less, favorably 0.1 atomic % or more and 0.5 atomic % or less, the content of the second additive element is adjusted to, for example, 0.2 atomic % or more and 3.0 atomic % or less, favorably 0.5 atomic % or more and 1.5 atomic % or less, and the content of the third additive element is adjusted to, for example, 0.1 atomic % or more and 1.0 atomic % or less, favorably 0.2 atomic % or more and 0.7 atomic % or less.

Such an Al alloy film has excellent bending resistance and synergistically exhibits the effect achieved by adding the first additive element, the effect achieved by adding the second additive element, and the effect achieved by adding the third additive element.

(Aluminum Alloy Target)

Each of the gate electrodes 13 and 23 formed of the above-mentioned Al alloy film is formed by, for example, sputtering deposition in a vacuum chamber. As a sputtering target used in sputtering deposition, an aluminum alloy target (Al alloy target) for forming the gate electrodes 13 and 23 of the thin film transistors 1 and 2 is used.

As the Al alloy target, a target having the same composition as that of the Al alloy film is prepared. For example, a metal piece, metal powder, or the like of at least one of the first additive element, the second additive element, or the third additive element is mixed with an AL pure metal piece of purity 5N (99.999%) or more, and a melting method such as induction heating is performed on the mixed materials in a crucible, thereby simply preparing the Al alloy target.

By setting the addition amount of at least one of the first additive element, the second additive element, or the third additive element to the above-mentioned range, the temperature difference between the solid phase line and the liquid phase line in the phase diagram of the metal compound is reduced, and an Al alloy ingot in which primary crystals due to intermetallic compounds or the like are unlikely to settle in the crucible is formed. That is, in the Al alloy ingot, at least one of the first additive element, the second additive element, or the third additive element is uniformly dispersed. Plastic working such as forging, rolling, and pressing is performed on the Al alloy ingot, the Al alloy ingot is processed into a plate shape or a disk shape, and thus, an Al alloy target is prepared.

For example, the Al alloy target includes the Al pure metal as a base material, and the Al pure metal includes at least one type of the first additive element selected from the group consisting of Zr, Sc, Mo, Y, Nb, and Ti. Here, in the Al alloy target, the content of the first additive element is adjusted to, for example, 0.01 atomic % or more and 1.0 atomic % or less, favorably 0.1 atomic % or more and 0.5 atomic % or less.

Further, in the Al alloy target, the Al pure metal may include, instead of the first additive element, at least one of the second additive element selected from the group consisting of Mn, Si, Cu, Ge, Mg, Ag, and Ni. In this case, in the Al alloy target, the content of the second additive element is adjusted to, for example, 0.2 atomic % or more and 3.0 atomic % or less, favorably 0.5 atomic % or more and 1.5 atomic % or less.

Further, in the Al alloy target, the first additive element and the second additive element may be added to the Al pure metal.

For example, in the Al alloy target, the Al pure metal may include at least one of the first additive element selected from the group consisting of Zr, Sc, Mo, Y, Nb, and Ti, and at least one of the second additive element selected from the group consisting of Mn, Si, Cu, Ge, Mg, Ag, and Ni. In this case, in the Al alloy target, the content of the first additive element is adjusted to, for example, 0.01 atomic % or more and 1.0 atomic % or less, favorably 0.1 atomic % or more and 0.5 atomic % or less, and the content of the second additive element is adjusted to, for example, 0.2 atomic % or more and 3.0 atomic % or less, favorably 0.5 atomic % or more and 1.5 atomic % or less.

Further, in the Al alloy target, the Al pure metal may include at least one type of the first additive element selected from the group consisting of Zr, Sc, Mo, Y, Nb, and Ti, and at least one type of the third additive element selected from the group consisting of Ce, Nd, La, and Gd. In this case, in the Al alloy target, the content of the first additive element is adjusted to, for example, 0.01 atomic % or more and 1.0 atomic % or less, favorably 0.1 atomic % or more and 0.5 atomic % or less, and the content of the third additive element is adjusted to, for example, 0.1 atomic % or more and 1.0 atomic % or less, favorably 0.2 atomic % or more and 0.7 atomic % or less.

Further, in the Al alloy target, the Al pure metal may include at least one type of the second additive element selected from the group consisting of Mn, Si, Cu, Ge, Mg, Ag, and Ni, and at least one type of the third additive element selected from the group consisting of Ce, Nd, La, and Gd. In this case, in the Al alloy target, the content of the second additive element is adjusted to, for example, 0.2 atomic % or more and 3.0 atomic % or less, favorably 0.5 atomic % or more and 1.5 atomic % or less, and the content of the third additive element is adjusted to, for example, 0.1 atomic % or more and 1.0 atomic % or less, favorably 0.2 atomic % or more and 0.7 atomic % or less.

Further, in the Al alloy target, the Al pure metal may include at least one type of the first additive element selected from the group consisting of Zr, Sc, Mo, Y, Nb, and Ti, at least one type of the second additive element selected from the group consisting of Mn, Si, Cu, Ge, Mg, Ag, and Ni, and at least one type of the third additive element selected from the group consisting of Ce, Nd, La, and Gd. In this case, in the Al alloy target, the content of the first additive element is adjusted to, for example, 0.01 atomic % or more and 1.0 atomic % or less, favorably 0.1 atomic % or more and 0.5 atomic % or less, the content of the second additive element is adjusted to, for example, 0.2 atomic % or more and 3.0 atomic % or less, favorably 0.5 atomic % or more and 1.5 atomic % or less, and the content of the third additive element is adjusted to, for example, 0.1 atomic % or more and 1.0 atomic % or less, favorably 0.2 atomic % or more and 0.7 atomic % or less.

An Al alloy film obtained by performing sputtering deposition using such an Al alloy target exhibits the abovementioned excellent effect.

Further, if the sputtering target is prepared by using only the Al pure metal, an Al ingot is subjected to heating during plastic working such as forging, rolling, and pressing, and Al crystal grains grow in the Al ingot in some cases. The Al crystal grains exits also in such an Al target prepared from an Al ingot, the Al crystal grains are subjected to heating from plasma during deposition, and protrusions are formed on the surface of the Al target. There is a possibility that the protrusions cause abnormal discharge or the protrusions jump out of the Al target during deposition.

Meanwhile, in the Al alloy target according to this embodiment, at least one of the first additive element, the second additive element, or the third additive element is added to the Al pure metal in the above-mentioned addition amount. As a result, even if the Al alloy ingot is subjected to heating during plastic working such as forging, rolling, and pressing, the Al alloy crystal grains are less likely to grow in the Al alloy ingot. Therefore, even if the Al alloy target is subjected to heating from plasma, protrusions are unlikely to be generated on the surface of the Al alloy target, and abnormal discharge and splash of protrusions are less likely to occur. Further, since abnormal discharge and splash of protrusions are suppressed, the Al alloy target can be applied to high-power sputtering deposition.

In particular, in the Al alloy ingot (or Al alloy target) to which at least one of Ce, Mn, or Si is added, the content of at least one of Ce, Mn, or Si in the grain boundary between particles is higher than the content of at least one of Ce, Mn, or Si in the particles. Here, the average particle size of the particles is adjusted to 10 μm or more and 100 μm or less. The average particle size is obtained by a laser diffraction method, image analysis using an electron microscope image, or the like.

As a result, in the Al alloy ingot (or Al alloy target), the grain boundary becomes a barrier, and the phenomenon that adjacent fine particles are connected and the fine particles become coarse is suppressed. As a result, the heat resistance of the Al alloy target is further improved.

EXAMPLE (Specific Example of Al Alloy Film)
Sputtering conditions for the Al alloy film are as follows.
Discharge method: DC discharge
Deposition temperature: room temperature (25° C.)
Deposition pressure: 0.3 Pa
Film thickness: 200 nm
The heat treatment of the Al alloy film is performed under a nitrogen atmosphere at 400° C. for one hour and at 600° C. for two minutes.

TABLE 1

| number of times | material | | | | |
|---|---|---|---|---|---|
| | Mo | Al | Al—0.3Sc—0.2Zr | Al—0.3Sc—1.2Zr | Al—0.3Sc—3.5Zr |
| 1 | N.C. | N.C. | N.C. | N.C. | N.C. |
| 1 × 10³ | C. | N.C. | N.C. | C. | C. |
| 1 × 10⁴ | C. | N.C. | N.C. | C. | C. |
| 1 × 10⁵ | C. | N.C. | N.C. | C. | C. |

| number of times | material | | | | |
|---|---|---|---|---|---|
| | Al—1.0Mn—0.5Si | Al—2.0Mn—0.5Si | Al—3.5Mn—0.5Si | Al—1.0Mn—3.0Si | Al—0.5Ce |
| 1 | N.C. | N.C. | N.C. | N.C. | N.C. |
| 1 × 10³ | N.C. | N.C. | C. | N.C. | N.C. |
| 1 × 10⁴ | N.C. | N.C. | C. | N.C. | N.C. |
| 1 × 10⁵ | N.C. | N.C. | C. | N.C. | N.C. |

| number of times | material | | |
|---|---|---|---|
| | Al—2.0Ce | Al—0.3Sc—0.2Zr—0.5Ce | Al—0.3Sc—0.2Zr—0.5Ce—1.0Mn—0.5Si |
| 1 | N.C. | N.C. | N.C. |
| 1 × 10³ | N.C. | N.C. | N.C. |
| 1 × 10⁴ | N.C. | N.C. | N.C. |
| 1 × 10⁵ | N.C. | N.C. | N.C. |

N.C.: no crack, C.: crack
R = 1 mm, unit: at %

Table 1 shows an example of the bending characteristics of a Mo film, an Al film, and an Al alloy film. The unit of concentration is atomic % (at %).

As the substrate of each sample, a SiN film (200 nm)/polyimide layer (25 μm) substrate having a 2-layer structure was used. In the sample for a bending test, sputtering deposition of each of the Mo film, the Al film, and the Al alloy film is performed on the SiN film. The bending radius in the bending test is 1 mm. The test speed is 30 rpm. The number of times of bending was 1, 1,000, 10,000, and 100,000 times in this order. The presence or absence of cracks was visually determined from an optical microscope image.

As shown in Table 1, cracks do not occur at the number of times of bending up to 100,000 times in the Al film, but cracks occur at the number of times of bending of 1,000 in the Mo film. Regarding the Al alloy film, cracks did not occur at the number of times of bending up to 100,000. However, cracks occurred at the number of times of bending of 1,000 in the case where the first additive element was added to the Al pure metal at the concentration of 1.5 at % higher than 1.0 at % (Al-1.2 at % Zr-0.3 at % Sc) and where the second additive element was added at the concentration of 4.0 at % higher than 3.0 at % (Al-3.5 at % Mn-0.5 at % Si).

TABLE 2

| anneal | | Al | Al—0.3Sc—0.2Zr | Al—0.3Sc—3.5Zr | Al—1.0Mn—0.5Si |
|---|---|---|---|---|---|
| as depo. | μ Ω cm | 3 | 6 | 25 | 15 |
| 400° C., 1 hr | | 3 | 4 | 18 | 5 |
| 600° C., 2 min | | 3 | 4 | 15 | 5 |
| as depo. | Rq | 3 | 4 | 4 | 2 |
| | P-V | 30 | 31 | 32 | 15 |
| 400° C., 1 hr | Rq | 17 | 7 | 6 | 5 |
| | P-V | 301 | 147 | 132 | 125 |
| 600° C., 2 min | Rq | 21 | 10 | 9 | 9 |
| | P-V | 371 | 129 | 125 | 131 |

| anneal | | Al—3.5Mn—0.5Si | Al—1.0Mn—3.0Si | Al—0.5Ce | Al—2.0Ce |
|---|---|---|---|---|---|
| as depo. | μ Ω cm | 50 | 21 | 8 | 15 |
| 400° C., 1 hr | | 21 | 14 | 4 | 4 |
| 600° C., 2 min | | 30 | 18 | 4 | 4 |
| as depo. | Rq | 2 | 2 | 3 | 3 |
| | P-V | 14 | 10 | 21 | 19 |
| 400° C., 1 hr | Rq | 4 | 6 | 4 | 3 |
| | P-V | 86 | 131 | 120 | 42 |
| 600 °C., 2 min | Rq | 4 | 7 | 6 | 4 |
| | P-V | 91 | 140 | 100 | 47 |

| anneal | | Al—0.3Sc—0.2Zr—0.5Ce | Al—0.3Sc—0.2Zr—1.0Mn | Al—0.3Sc—0.2Zr—0.5Ce—1.0Mn—0.5Si |
|---|---|---|---|---|
| as depo. | μ Ω cm | 9 | 15 | 17 |
| 400° C., 1 hr | | 4 | 5 | 5 |
| 600° C., 2 min | | 4 | 6 | 6 |
| as depo. | Rq | 3 | 2 | 2 |
| | P-V | 21 | 12 | 13 |
| 400° C., 1 hr | Rq | 5 | 3 | 3 |
| | P-V | 65 | 46 | 50 |
| 600° C., 2 min | Rq | 5 | 3 | 4 |
| | P-V | 73 | 50 | 46 |

Unit: at %

Table 2 shows an example of the specific resistance (μΩ·cm) and surface roughness (nm) of the Al film and the Al alloy film.

As shown in Table 2, it can be seen that the specific resistance of the Al alloy film is 10 μΩ·cm or less in the case where the Al pure metal includes the first additive element, i.e., Sc and Zr at 0.01 at % or more and 1.0 at % or less. Further, it can be seen that the specific resistance of the Al alloy film is 10 μΩ·cm or less also in the case where the Al pure metal includes the second additive element, i.e., Mn and Si at 0.2 at % or more and 3.0 at % or less.

Further, the surface roughness is measured by AFM (Atomic Force Microscopy). The surface roughness is observed immediately after deposition (As Depo.), after one hour at 400° C., and after two minutes at 600° C. The measurement range is 5 μm square. The upper part of each column shows the Rq value (nm), and the lower part shows the P–V value (nm). Here, the Rq value is the root mean square height, and the P–V value is the difference between the highest peak (peak) and the lowest valley (valley). As hillocks grow, the P–V value tends to increase. In order to produce a highly reliable display device, it is favorable that the P–V value of the wiring film is smaller, favorably 50 nm or less. In particular, by applying an Al alloy film having a P–V value of 50 nm or less to the bend portion of the display panel, adhesion with the upper layer of the Al alloy film is favorable even if the Al alloy film is bent.

As shown in Table 2, immediately after deposition, the surface roughness of any of the Al film and the Al alloy film is 50 nm or less. However, after applying heat treatment, the P–V value of the Al film exceeds 300 nm. Meanwhile, any of the Al alloy films has a P–V value lower than that of the Al film. That is, it can be determined that in the Al alloy film, hillocks are less likely to grow in the film as compared with the Al film even in the case where heat treatment is performed.

In particular, it was found that by adding both the first additive element and the second additive element to the Al pure metal as in Al-0.2 at % Zr-0.3 at % Sc-1.0 at % Mn and Al-0.5 at % Ce-0.2 at % Zr-0.3 at % Sc-1.0 at % Mn-0.5 at % Si, the surface roughness P–V value was 50 nm or less even in the case where heat treatment was performed. This is presumably because the first additive element and the second additive element synergistically act in the Al alloy film and the Al alloy film has excellent resistance to heat load.

TABLE 3

| etching | | material | | | | |
|---|---|---|---|---|---|---|
| time/sec | | Al | Al—0.3Sc—0.2Zr | Al—0.3Sc—3.5Zr | Al—1.0Mn—0.5Si | Al—3.5Mn—0.5Si |
| dry | 50 | N.R. | N.R. | R. | N.R. | R. |
|  | 60 | N.R. | N.R. | R. | N.R. | R. |
| wet | 40 | N.R. | N.R. | R. | N.R. | N.R. |
|  | 50 | N.R. | N.R. | R. | N.R. | N.R. |
|  | 60 | N.R. | N.R. | R. | N.R. | N.R. |

| etching | | material | | | | |
|---|---|---|---|---|---|---|
| time/sec | | Al—1.0Mn—3.0Si | Al—0.5Ce | Al—2.0Ce | Al—0.3Sc—0.2Zr—0.5Ce | Al—0.3Sc—0.2Zr—0.5Ce—1.0Mn—0.5Si |
| dry | 50 | N.R. | N.R. | R. | N.R. | N.R. |
|  | 60 | N.R. | N.R. | R. | N.R. | N.R. |
| wet | 40 | R. | N.R. | N.R. | N.R. | N.R. |
|  | 50 | R. | N.R. | N.R. | N.R. | N.R. |
|  | 60 | R. | N.R. | N.R. | N.R. | N.R. |

N.R.: no residue, R.: residue unit: at %

Table 3 shows an example of the presence or absence of residues after etching the Al film and the Al alloy film.

In dry etching, the etching gas is a mixed gas of Cl₂ (50 sccm)/Ar (20 sccm). The etching pressure is 1.0 Pa. The discharge power is 400 W in the case where the substrate bias power is 200 W. As the wet etching solution, a mixed solution (commonly called PAN) of phosphoric acid/nitric acid/acetate/water is used. The liquid temperature is 40° C.

As shown in Table 3, in any of the Al alloy films (Al-0.5 at % Ce, Al-0.3 at % Sc-0.2 at % Zr-0.5 at % Ce, and Al-0.3 at % Sc-0.2 at % Zr-0.5 at % Ce-1.0 at % Mn-0.5 at % Si) that includes 0.5 at % of Ce, which is the third additive element, dry etching and wet etching can be performed without any residue. Meanwhile, in the case where the concentration of Ce increased, e.g., in the Al alloy film (Al-2.0 at % Ce) that includes 2.0 at % of Ce, a residue was generated by dry etching.

Note that in both dry etching and wet etching, it was found that a residue was generated in Al-0.3 at % Sc-3.5 at % Zr having a lager content of Zr as compared with that of Al-0.3 at % Sc-0.2 at % Zr. Further, in dry etching, it was found that a residue was generated in Al-3.5 at % Mn-0.5 at % Si having a larger content of Mn as compared with that of Al-1.0 at % Mn-0.5 at % Si. Meanwhile, in wet etching, it was found that a residue was generated in Al-1.0 at % Mn-3.0 at % Si having a larger content of Si as compared with that of Al-1.0 at % Mn-0.5 at % Si.

(Specific Example of Al Alloy Target)

For example, metal materials (metal pieces, metal powder) of Al, Sc, Zr, Mn, Si, and Ce are placed in a crucible. For example, the respective metal materials (metal pieces, metal powder) are placed in the crucible so that the component ratio of the additive elements of the Al alloy target is 0.2 at % Sc, 0.1 at % Zr, 1.0 at % Mn, 0.5 at % Si, and 0.5 at % Ce.

Next, the respective metal materials are heated by induction heating to a melting temperature (e.g., 1050° C.) higher than the melting point (e.g., 640° C.) of the Al alloy by 400° C. or more, and melted in the crucible. Next, the molten metal is cooled from this melting temperature to room temperature to form an aluminum alloy ingot. After that, the aluminum alloy ingot is forged as necessary, and the aluminum alloy ingot is cut into a plate shape or a disk shape. As a result, an Al alloy target is formed.

Here, examples of the method of forming an alloy ingot for a sputtering target include a method of forming an alloy ingot by melting a metal material at a melting temperature slightly higher than the melting point of the metal material and cooling the metal material from the slightly high melting temperature. This is to avoid precipitation of intermetallic compounds that are formed during the cooling process, by shortening the cooling time until being cooled from the molten state. However, in this method, since the melting temperature is set to a temperature slightly higher than the melting point, there is a possibility that the metal material is not sufficiently mixed.

Meanwhile, in this Example, since the metal materials are heated and melted at a melting temperature higher than the melting point of the Al alloy by 400° C. or more, the respective materials are sufficiently mixed with each other. Here, it is also considered that the higher the melting temperature, the longer the cooling time from the melting temperature to room temperature, and the easier intermetallic compounds precipitate. However, in this embodiment, the concentration of the additive element is adjusted so that intermetallic compounds are hardly precipitated in the Al alloy ingot even in the case where the Al alloy ingot is cooled from the melting temperature higher than the melting point of the Al alloy by 400° C. or more.

Figure 2:
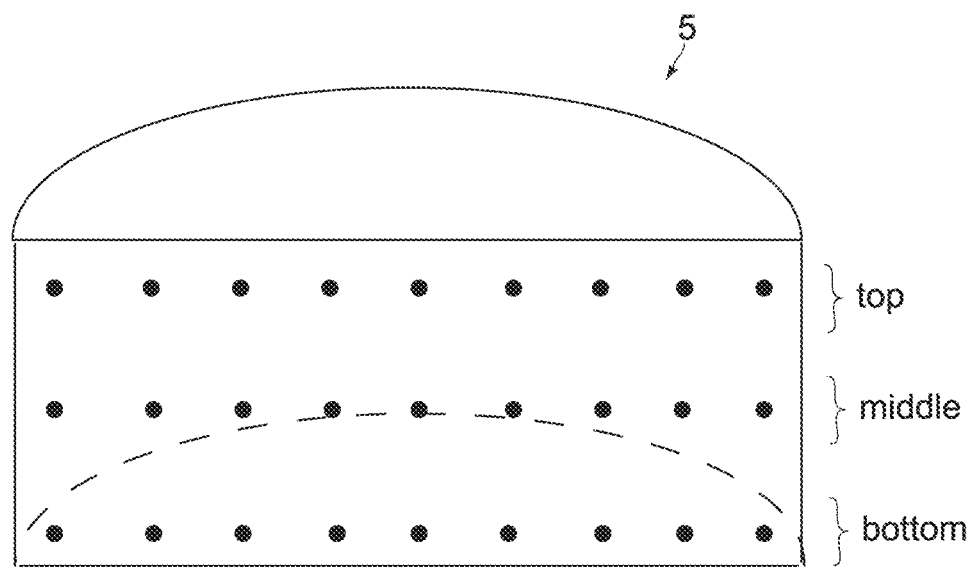
FIG. 2 is a conceptual diagram describing observation points for composition analysis of an Al alloy ingot illustrated in Table 4.

FIG. 2 is a conceptual diagram describing observation points for composition analysis of the Al alloy ingot illustrated in Table 4.

Table 4 shows an example of the concentration distribution of each element included in the Al alloy ingot.

TABLE 4

Al-0.2Sc-0.1Zr-1.0Mn-0.5Si-0.5Ce unit: at %

| position | atom | | | | |
| --- | --- | --- | --- | --- | --- |
| | Sc | Zr | Mn | Si | Ce |
| top | 0.19 ± 0.02 | 0.10 ± 0.02 | 0.96 ± 0.15 | 0.52 ± 0.18 | 0.47 ± 0.21 |
| middle | 0.20 ± 0.01 | 0.10 ± 0.02 | 0.99 ± 0.10 | 0.54 ± 0.15 | 0.50 ± 0.11 |
| bottom | 0.20 ± 0.02 | 0.10 ± 0.01 | 1.02 ± 0.11 | 0.59 ± 0.15 | 0.53 ± 0.04 |

FIG. 2 illustrates, for example, a semi-cylindrical Al alloy ingot 5 obtained by dividing a cylindrical Al alloy ingot (100 mm diameter×50 mmt).

As observation points for composition analysis in the Al alloy ingot 5, the total of 27 points, i.e., nine points at equal intervals in the horizontal direction at the top position, nine points at equal intervals in the horizontal direction at the middle position, and nine points at equal intervals in the horizontal direction at the bottom position, are selected. Table 4 shows the average concentration (at %) measured from the nine observation points of each element at the top position, the average concentration (at %) measured from the nine observation points of each element at the middle position, and the average concentration (at %) measured from the nine observation points of each element at the bottom position. Table 4 also shows the deviation±3σ of the average value of concentrations.

As shown in Table 4, regarding the component ratio of the additive element of the Al alloy ingot, Sc is approximately 0.2 at %, Zr is approximately 0.1 at %, Mn is approximately 1.0 at %, Si is approximately 0.5 at %, and Ce is approximately 0.5 at % in any position of top, middle, and bottom, and it can be seen that in the Al alloy ingot, the respective metal materials are uniformly dispersed in the longitudinal direction and the lateral direction of the Al alloy ingot.

TABLE 5

Al-0.2Sc-3.5Zr unit: at %

| position | atom Zr |
| --- | --- |
| top | 0.94 ± 0.21 |
| middle | 3.21 ± 1.02 |
| bottom | 5.31 ± 2.31 |

Meanwhile, Table 5 shows the Zr concentration distribution of the aluminum alloy ingot in the case where 0.2 at % of Sc and 3.5 at % of Zr are added. The production method is the same as that for the aluminum alloy ingot shown in Table 4. As shown in Table 5, it was found that the Zr concentration increased from top toward bottom of the aluminum alloy ingot in the case where the Zr concentration was increased to 3.5 at %. The electron microscope image in this case is shown in FIG. 3.

Figure 3:
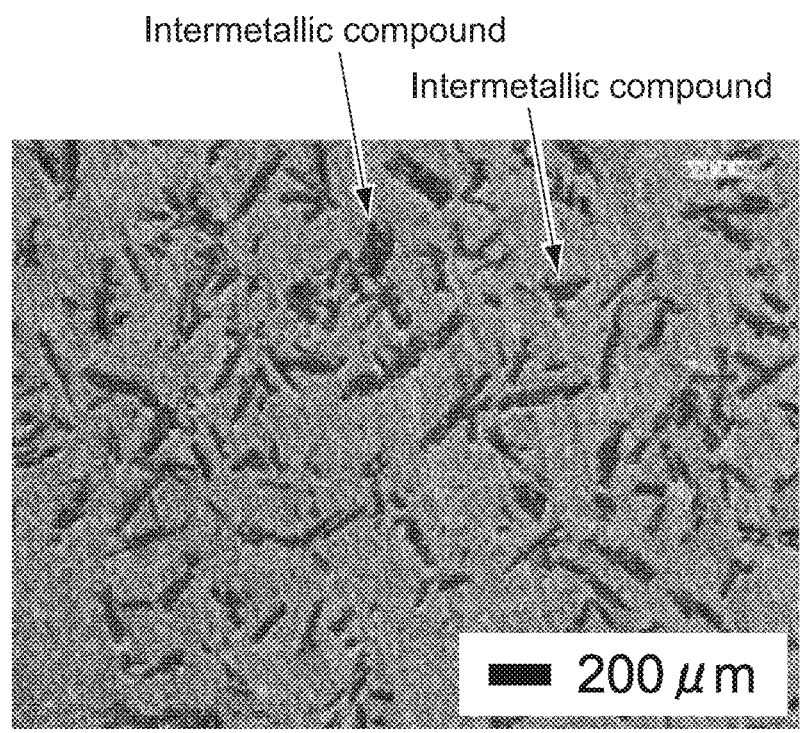
FIG. 3 is an optical microscope image of an aluminum alloy ingot shown in Table 5.

FIG. 3 is an optical microscope image of the aluminum alloy ingot shown in Table 5.

As shown in FIG. 3, it was found that crystal grains (intermetallic compounds) having a grain size of approximately several hundred μm exist in the aluminum alloy ingot shown in Table 5.

Figure 4A:
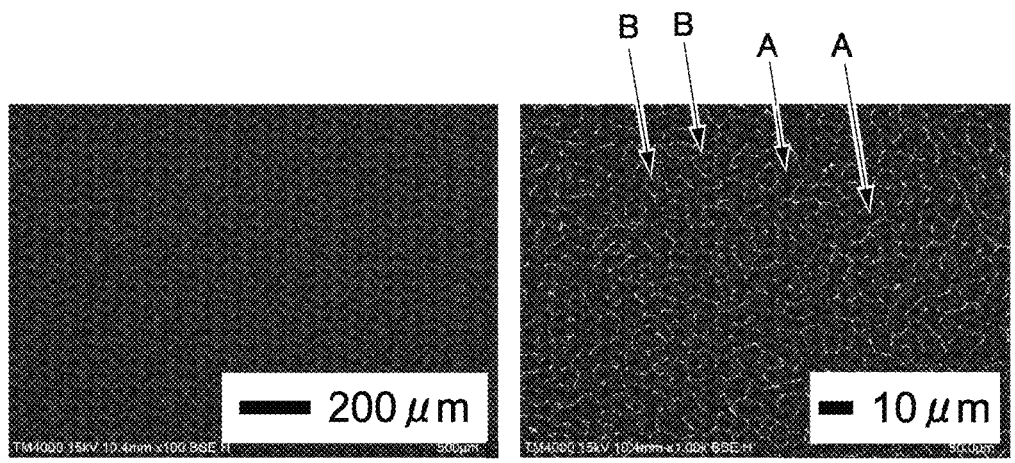
FIGS. 4A and 4B are electron microscope images of an aluminum alloy ingot according to this embodiment.
Figure 4B:
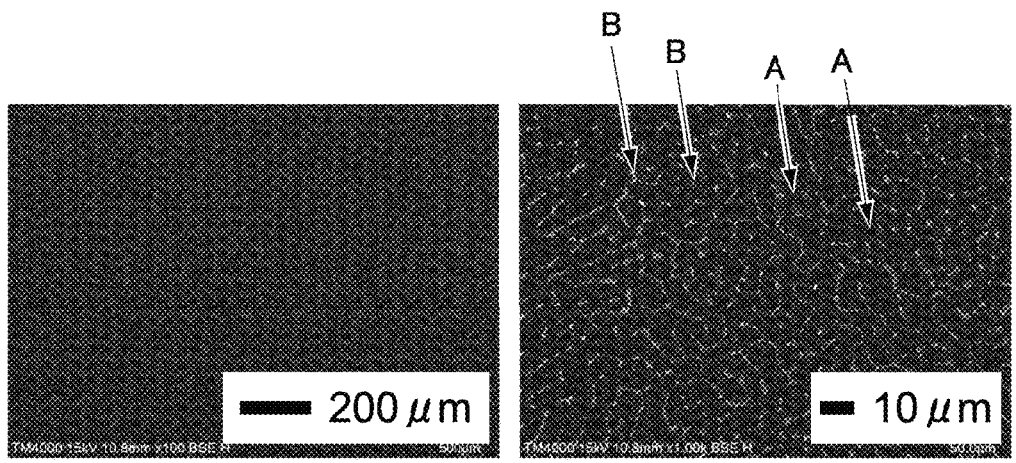

FIG. 4A and FIG. 4B are each an electron microscope image of an aluminum alloy ingot according to this embodiment.

FIG. 4A shows a surface electron microscope image of the aluminum alloy ingot shown in Table 4. Further, FIG. 4B shows a surface electron microscope image of the aluminum alloy ingot after performing heat treatment on the aluminum alloy ingot shown in Table 4 at 600° C. for two hours. The right images in FIGS. 4A and 4B are images obtained by enlarging the scale of the left images.

As shown on the left of FIG. 4, immediately after preparing the aluminum alloy ingot, crystal grains (intermetallic compounds) having a grain size of approximately several hundred μm are not observed. However, as shown on the right of FIG. 4A, the aluminum alloy ingot included aggregates of particles A having an average particle size of approximately 10 μm. Then, in the case where the component of a grain boundary B between the particles A was analyzed by EDX analysis, high concentrations of Ce, Mn, and Si were observed at the grain boundary B. That is, it was found that the content of at least one of Ce, Mn, or Si at the grain boundary between the particles A was higher than the content of at least one of Ce, Mn, or Si in the particles A.

Further, FIG. 4B shows an image obtained by performing heat treatment at 600° C. for two hours from the state of FIG. 4A. Even in this case, the particle size was approximately 10 μm at most, the particles A were not bonded to each other to grow into huge particles, and new particles (e.g., intermetallic compounds) were not precipitated in the particles A. This is presumably because the grain boundary B becomes a barrier and the phenomenon that the adjacent particles A are connected and the particles become coarse is suppressed in the Al alloy ingot, Zr and Sc are uniformly dispersed in the particles A, and the grain growth is suppressed. It is considered that as a result thereof, the heat resistance of the Al alloy target has been improved.

Although an embodiment of the present invention has been described above, it goes without saying that the present invention is not limited to only the above-mentioned embodiment and various modifications can be made. Each embodiment is not limited to an independent embodiment, and can be combined as technically possible.

For example, although an example in which the Al alloy film is applied to the gate electrodes 13 and 23 has been shown in the above-mentioned embodiment, the Al alloy film is applicable to a source•drain electrode, another electrode other than the source•drain electrode, or a wiring.

REFERENCE SIGNS LIST 1, 2 thin film transistor
10, 20 glass substrate
11, 21 active layer
12, 22 gate insulating layer
13, 23 gate electrode
protective layer
16D, 26D drain electrode
16S, 26S source electrode

The invention claimed is:

1. An aluminum alloy film formed by a sputtering method on a substrate, the aluminum alloy film comprising:
an Al pure metal that includes Zr, Sc, and at least one type of a first additive element selected from the group consisting of Mo, Y, Nb, and Ti, the first additive element forming intermetallic compounds of Al;
Mn, Si, and at least one type of a second additive element selected from the group consisting of Mg and Ag, the second additive element being dissolved in Al; and
at least one type of a third additive element selected from the group consisting of Ce, Nd, La, and Gd;
a total content of Zr, Sc, and the first additive element being 0.01 atomic % or more and 1.0 atomic % or less,
a total content of Mn, Si, and the second additive element being 0.2 atomic % or more and 3.0 atomic % or less, and
a total content of the third additive element being 0.1 atomic % or more and 1.0 atomic % or less.

2. The aluminum alloy film according to claim 1, wherein the aluminum alloy film has bending resistance that can withstand bending in a case of being bent to a bending radius of 1 mm.

3. The aluminum alloy film according to claim 1, wherein dry etching and wet etching of the aluminum alloy film are possible under the conditions that:
as the dry etching, an etching gas is a mixed gas of $Cl_2$ (50 sccm)/Ar (20 sccm), an etching pressure is 1.0 Pa, and discharge power is 400 W in a case where the substrate bias power is 200 W; and
as the wet etching solution, a mixed solution of phosphoric acid/nitric acid/acetate/water is used and a liquid temperature is 40° C.

4. The aluminum alloy film according to claim 1, wherein a surface roughness P–V value is 50 nm or less.

5. The aluminum alloy film according to claim 1, wherein specific resistance is 10 μ106 ·cm or less.

6. A thin film transistor, comprising:
a gate electrode including an aluminum alloy film,
the aluminum alloy film including:
an Al pure metal that includes Zr, Se, and at least one type of a first additive element selected from the group consisting of Mo, Y, Nb, and Ti, the first additive element forming intermetallic compounds of Al;
Mn, Si, and at least one type of a second additive element selected from the group consisting of Mg and Ag, the second additive element being dissolved in Al; and
at least one type of a third additive element selected from the group consisting of Ce, Nd, La, and Gd,
a total content of Zr, Sc, and the first additive element being 0.01 atomic % or more and 1.0 atomic % or less,
a total content of Mn, Si, and the second additive element being 0.2 atomic % or more and 3.0 atomic % or less, and
a total content of the third additive element being 0.1 atomic % or more and 1.0 atomic % or less.

7. A production method of an aluminum alloy film, the production method comprising:
including Zr, Sc, and at least one type of a first additive element selected from the group consisting of Mo, Y, Nb, and Ti;
including Mn, Si, and at least one type of a second additive element selected from the group consisting of Mg and Ag;
further including at least one type of a third additive element selected from the group consisting of Ce, Nd, La, and Gd;
by a sputtering method using an Al alloy target in an Al pure metal; and producing an aluminum alloy film having
- a total content of Zr, Sc, and the first additive element of 0.01 atomic % or more and 1.0 atomic % or less on a substrate, the first additive element forming intermetallic compounds of Al,
- a total content of Mn, Si, and the second additive element of 0.2 atomic % or more and 3.0 atomic % or less on a substrate, the second additive element being dissolved in Al, and
- a total content of the third additive element being 0.1 atomic % or more and 1.0 atomic % or less.

\* \* \* \* \*